United States Patent
Kuwahara et al.

(10) Patent No.: US 11,101,156 B2
(45) Date of Patent: Aug. 24, 2021

(54) SUBSTRATE TREATING APPARATUS

(71) Applicant: SCREEN Holdings Co., Ltd., Kyoto (JP)

(72) Inventors: Joji Kuwahara, Kyoto (JP); Yukihiko Inagaki, Kyoto (JP); Seiji Murai, Kyoto (JP)

(73) Assignee: SCREEN Holdings Co., Ltd.

( * ) Notice: Subject to any disclaimer, the term of this patent is extended or adjusted under 35 U.S.C. 154(b) by 58 days.

(21) Appl. No.: 16/449,531

(22) Filed: Jun. 24, 2019

(65) Prior Publication Data
US 2020/0098607 A1 Mar. 26, 2020

(30) Foreign Application Priority Data
Sep. 21, 2018 (JP) .............................. JP2018-178013

(51) Int. Cl.
*H01L 21/677* (2006.01)
*B05C 13/02* (2006.01)

(52) U.S. Cl.
CPC ........ *H01L 21/67706* (2013.01); *B05C 13/02* (2013.01); *H01L 21/6773* (2013.01); *H01L 21/67712* (2013.01); *H01L 21/67724* (2013.01); *H01L 21/67733* (2013.01)

(58) Field of Classification Search
CPC ......... H01L 21/67706; H01L 21/67733; H01L 21/67712; H01L 21/6773; H01L 21/67724; H01L 21/67778; H01L 21/67781; H01L 21/67745; H01L 21/67173; H01L 21/67178; H01L 21/67766;
(Continued)

(56) References Cited

U.S. PATENT DOCUMENTS

| 8,827,621 B2 * | 9/2014 | Inagaki ............. H01L 21/67733 414/282 |
| 10,290,521 B2 | 5/2019 | Fukutomi et al. |

(Continued)

FOREIGN PATENT DOCUMENTS

| JP | 2009-10291 A | 1/2009 |
| JP | 2009-094460 A | 4/2009 |
| JP | 2010-087115 A | 4/2010 |

(Continued)

OTHER PUBLICATIONS

Office Action dated Dec. 17, 2020 for corresponding Korean Patent Application No. 10-2019-0090866.

(Continued)

*Primary Examiner* — Laura Edwards
(74) *Attorney, Agent, or Firm* — Ostrolenk Faber LLP

(57) ABSTRACT

A substrate treating apparatus includes the following elements: an indexer block including indexer robots provided for respective carrier receivers and disposed in horizontally fixed positions, each of the indexer robots having arms for taking substrates out of a carrier and loading the substrates into the carrier on the carrier receiver; a bridge block disposed adjacent the indexer block; and a treating block including a plurality of stacked stories each having at least one treating unit. The bridge block includes a buffer, a pass having a plurality of tables covering a range from a bottom story to a top story of the plurality of stories, and two bridge robots each having an arm for transferring the substrates to and from the pass.

20 Claims, 6 Drawing Sheets

(58) Field of Classification Search
CPC ......... H01L 21/67748; H01L 21/67167; H01L 21/67201; H01L 21/67742; B05C 13/02
USPC ....................................................... 118/500
See application file for complete search history.

(56) References Cited

U.S. PATENT DOCUMENTS

2009/0081009 A1* 3/2009 Yamamoto ........ H01L 21/67775
 414/222.08
2010/0228378 A1* 9/2010 Fukutomi ......... H01L 21/67769
 700/112

FOREIGN PATENT DOCUMENTS

| | | |
|---|---|---|
| JP | 2013-069917 A | 4/2013 |
| JP | 2013-222949 A | 10/2013 |
| JP | 2016-139828 A | 8/2016 |
| KR | 10-2013-0096182 A | 8/2013 |
| KR | 10-2015-0050283 A | 5/2015 |

OTHER PUBLICATIONS

Office Action dated Dec. 25, 2020 for corresponding Taiwanese Patent Application No. 108123530.
Notice of Allowance dated May 20, 2021 for corresponding Korean Patent Application No. 10-2019-0090866.

\* cited by examiner

SUBSTRATE TREATING APPARATUS

BACKGROUND OF THE INVENTION

(1) Field of the Invention

This invention relates to a substrate treating apparatus which carries out predetermined treatment of various substrates (hereinafter called simply substrates) such as semiconductor wafers, substrates for liquid crystal displays, substrates for plasma displays, substrates for organic EL, substrates for FEDs (Field Emission Displays), substrates for optical displays, substrates for magnetic disks, substrates for magneto-optical disks, substrates for photomasks, substrates for solar cells, and so on. More particularly, the invention relates to a technique for transporting the substrates.

(2) Description of the Related Art

Conventionally, a known apparatus of this type includes a carrier block, a treating block, an interface block, and an exposing device (see Japanese Unexamined Patent Publication No. 2013-69917, for example).

The carrier block includes four carrier receivers for receiving carriers containing substrates to be treated, and empty carriers to be loaded with treated substrates. The carrier block further includes two indexer robots arranged in positions opposed to the carrier receivers and having transfer arms for taking the substrates out of the carriers placed on the carrier receivers, and loading the substrates into the empty carriers placed on the carrier receivers. A tower is disposed between the two indexer robots for transferring the substrates to and from the treating block. These indexer robots are horizontally movable according to positions of the four carrier receivers, and vertically movable according to the height of the tower to cover positions corresponding to a bottom story through to a top story among stories of the treating block.

The treating block is constructed to be a six-story block. The treating block includes solution treating units and other units on each story for treating the substrates. Each story has a main arm in the middle in plan view, solution treating units on one side of a transport path of the main arm, and heating and other units on the other side. The treating block has a transfer arm and a rack unit ranging from the bottom story to the top story.

The interface block serves to transport the substrates between the treating block and the exposing device.

The apparatus with the above construction takes the substrates from the tower of the carrier block into the rack unit, and distributes the substrates through the rack unit and transfer arm to the six stories for treatment in the treating block. This can treat an increased number of substrates per hour. Nowadays, however, improvement in throughput of the substrate treating apparatus is desired for further improvement in productivity. Therefore, in order to improve throughput without increasing the footprint, it is proposed to further increase the number of stories in the treating block.

SUMMARY OF THE INVENTION

However, the conventional example with such construction has the following problem.

That is, the conventional apparatus, in view of an increase in height occurring with an increased number of stories in the treating block, needs to increase also the height of the tower of the carrier block for transferring substrates to and from the treating block. However, the carrier block transfers the carriers between the carrier receivers and an OHT (Overhead Hoist Transport: also called an overhead traveling automatic guided vehicle) which transports the carriers using the ceiling of a cleanroom. The tower with an increased height in the carrier block may therefore interfere with the OHT. Consequently, the height of the tower in the carrier block cannot be increased. Even if the number of stories in the treating block is increased, the efficiency of substrate transport between the carrier block and treating block remains low. There is a problem that throughput cannot be as improved as expected in spite of the increased number of stories in the treating block.

This invention has been made having regard to the state of the art noted above, and its object is to provide a substrate treating apparatus which can improve throughput in response to an increase in the number of stories in a treating block.

To fulfill the above object, this invention provides the following construction.

A substrate treating apparatus according to this invention comprises an indexer block including at least two carrier receivers for transferring carriers storing substrates to and from an overhead traveling automatic guided vehicle, and indexer robots provided for the respective carrier receivers and disposed in horizontally fixed positions relative to the carrier receivers, each of the indexer robots having arms capable of advancing and withdrawing horizontally, rotating in horizontal planes, and movable up and down for taking the substrates out of the carrier on the carrier receiver and loading the substrates into the carrier on the carrier receiver; a bridge block disposed adjacent the indexer block; and a treating block disposed adjacent the bridge block and including a plurality of stacked stories each having at least one treating unit; wherein the indexer block has a height less than a top story of the treating block; and the bridge block includes a buffer disposed in a position adjacent the indexer block to be capable of transferring the substrates with the indexer robots, and having a plurality of tables arranged in a height direction for receiving the substrates; a pass disposed in a position adjacent the treating block to be capable of transferring the substrates to and from the treating block, and having a plurality of tables arranged in a direction of the stories of the treating block and covering a range from a bottom story to a top story of the treating block for receiving the substrates; and two bridge robots each having an arm for transferring the substrates to and from the pass.

According to this invention, the bridge block has a pass ranging from bottom story to top story in the treating block. Consequently, although the arms of the indexer robots do not reach the top story of the treating block, the bridge block with the two bridge robots can transport the substrates placed in the buffer from the carriers on the carrier receivers by the indexer robots, through the pass also to the treating unit on the top story in the treating block. As a result, throughput can be improved with an increase in the number of stories in the treating block.

In this invention, it is preferred that the treating block includes one transport robot for each predetermined number of stories for transferring the substrates to and from the treating unit and the pass; and the pass includes a plurality of discrete pass portions arranged separately for the each predetermined number of stories.

The transport robot provided for transporting the substrates between treating units on each predetermined number of stories can improve the efficiency of transporting the substrates between the treating units. With the pass including a plurality of discrete pass portions, a weight saving of the pass portions can be attained.

In this invention, it is preferred that, of the discrete pass portions, an upper discrete pass portion is located at a downward level relative to the stories, a middle discrete pass portion is located at a middle level relative to the stories, and a lower discrete pass portion is located at an upward level relative to the stories.

The above construction can shorten distances of up-and-down movement required of the bridge robots to transfer the substrates to and from the discrete pass portions. Consequently, the efficiency of transport by the bridge robots to and from the discrete pass portions can be improved.

In this invention, it is preferred that the treating block has, omitted therefrom, a partition between transport robots each provided for the predetermined number of stories.

Since there is no partition separating the transport robots each provided for the predetermined number of stories, the operator can work with increased ease for maintenance of the transport robots.

In this invention, it is preferred that the treating unit has a function for supplying a treating solution to the substrates; and pumps and filters, which supply the treating solution to the treating unit on each story from a treating solution tank disposed in a lower part for storing the treating solution, are arranged below a top story of the plurality of stories.

The pumps and filters are arranged below the treating unit on the top story can inhibit negative pressure occurring at the time of sucking up the treating solution from treating solution tanks. Consequently, foaming of the treating solution can be inhibited to improve the quality of treatment with the treating solution.

In this invention, it is preferred that the indexer block has the indexer robots each located opposite one of the carrier receivers.

Since each indexer robot is located in a position opposed to one of the carrier receivers, the arms can be moved efficiently when the indexer robots transfer the substrates to and from the carrier receivers.

In this invention, it is preferred that at least two carrier receivers are arranged vertically; and the buffer has a height equal to or lower than an upper end of a carrier placed on an uppermost one of the carrier receivers.

The height to which the indexer robots move upward when the substrates are transported between the carriers and buffer by the indexer robots is restricted, whereby the transportation can be carried out efficiently.

In this invention, it is preferred that at least two carrier receivers are arranged vertically; and the buffer has a height equal to or higher than a lower end of a carrier placed on a lowermost one of the carrier receivers.

The height to which the indexer robots move downward when the substrates are transported between the carriers and buffer by the indexer robots is restricted, whereby the transportation can be carried out efficiently.

In this invention, it is preferred that the buffer has a height equal to or lower than an upper end of an uppermost pass portion, and equal to or higher than a lower end of a lowermost pass portion.

The heights to which the indexer robots move upward and downward when the substrates are transported between the carriers and buffer by the indexer robots are restricted, whereby the transportation can be carried out efficiently.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of this invention will be described hereinafter with reference to the drawings.

Figure 1:
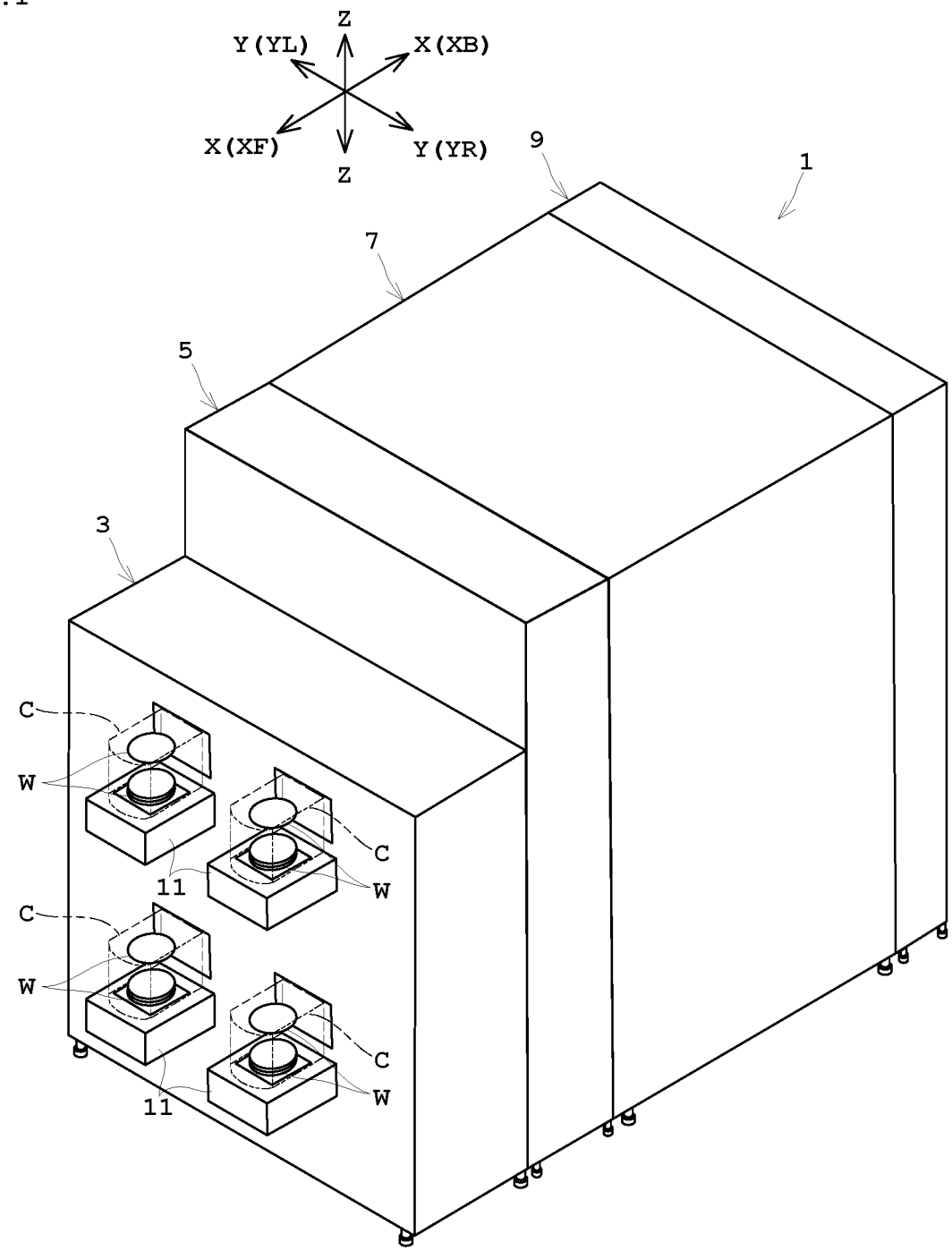
FIG. 1 is a perspective view showing an entire construction of a substrate treating apparatus according to an embodiment.
Figure 2:
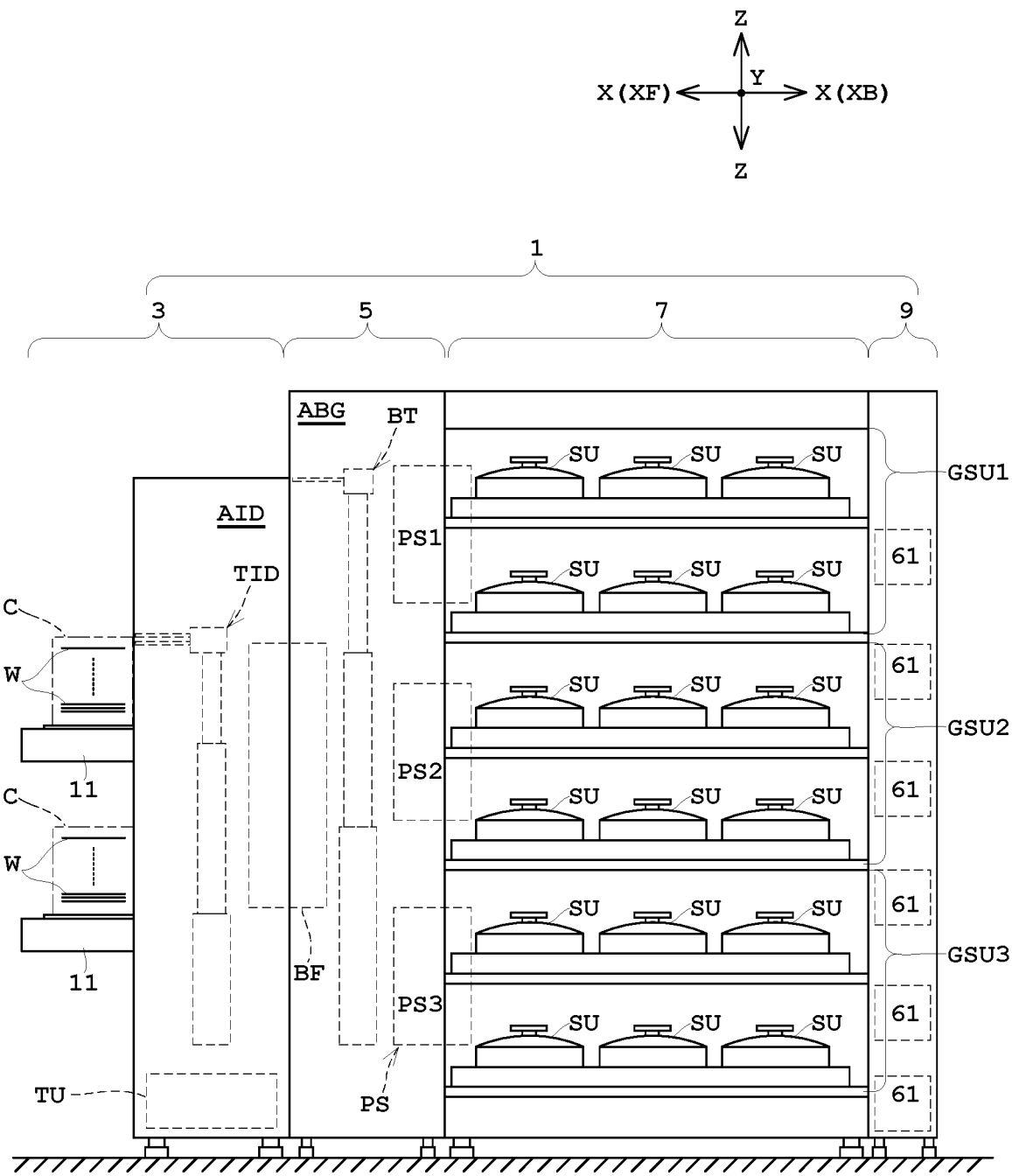
FIG. 2 is a right side view of the substrate treating apparatus.
Figure 3:
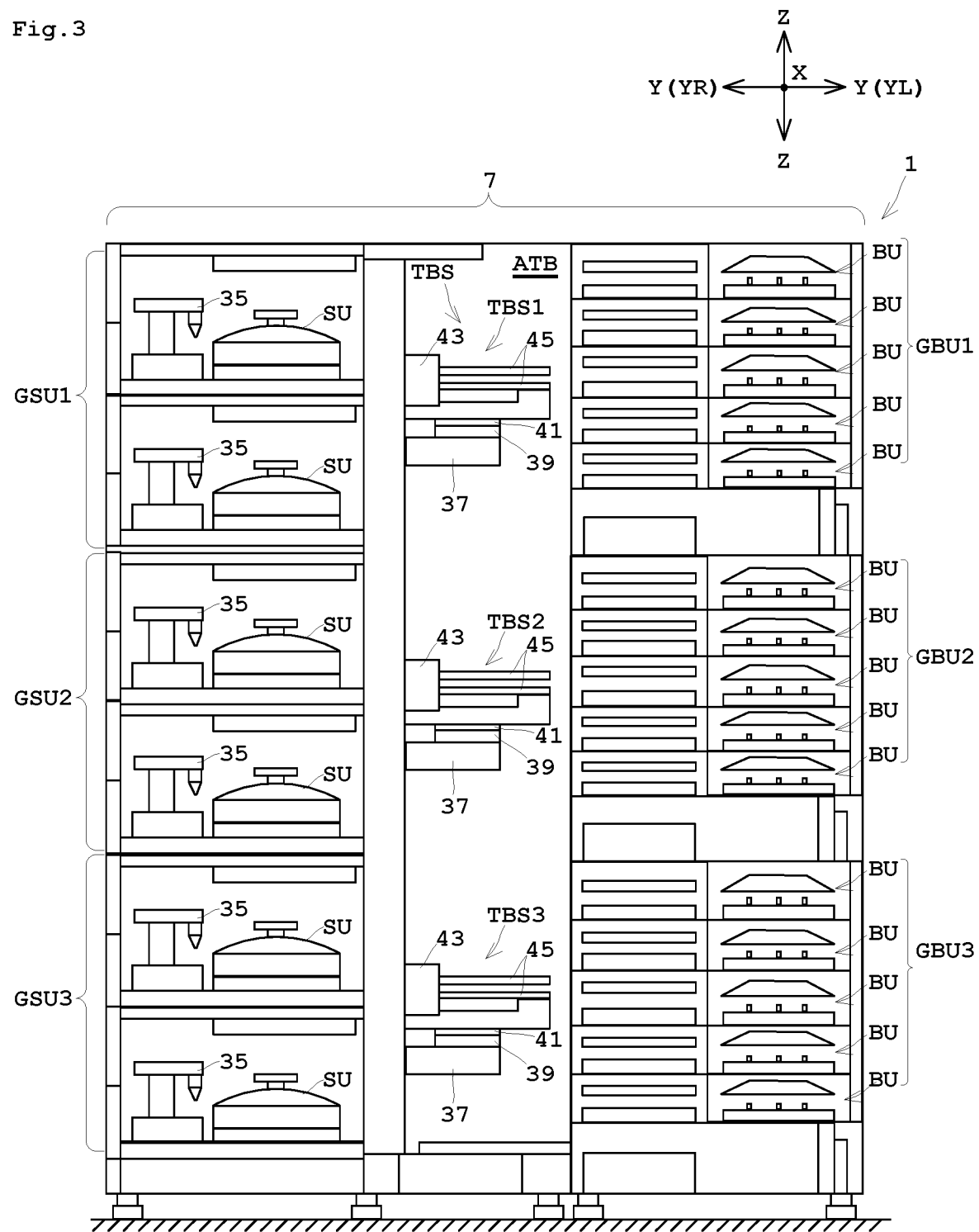
FIG. 3 is a rear view of the substrate treating apparatus.
Figure 4:
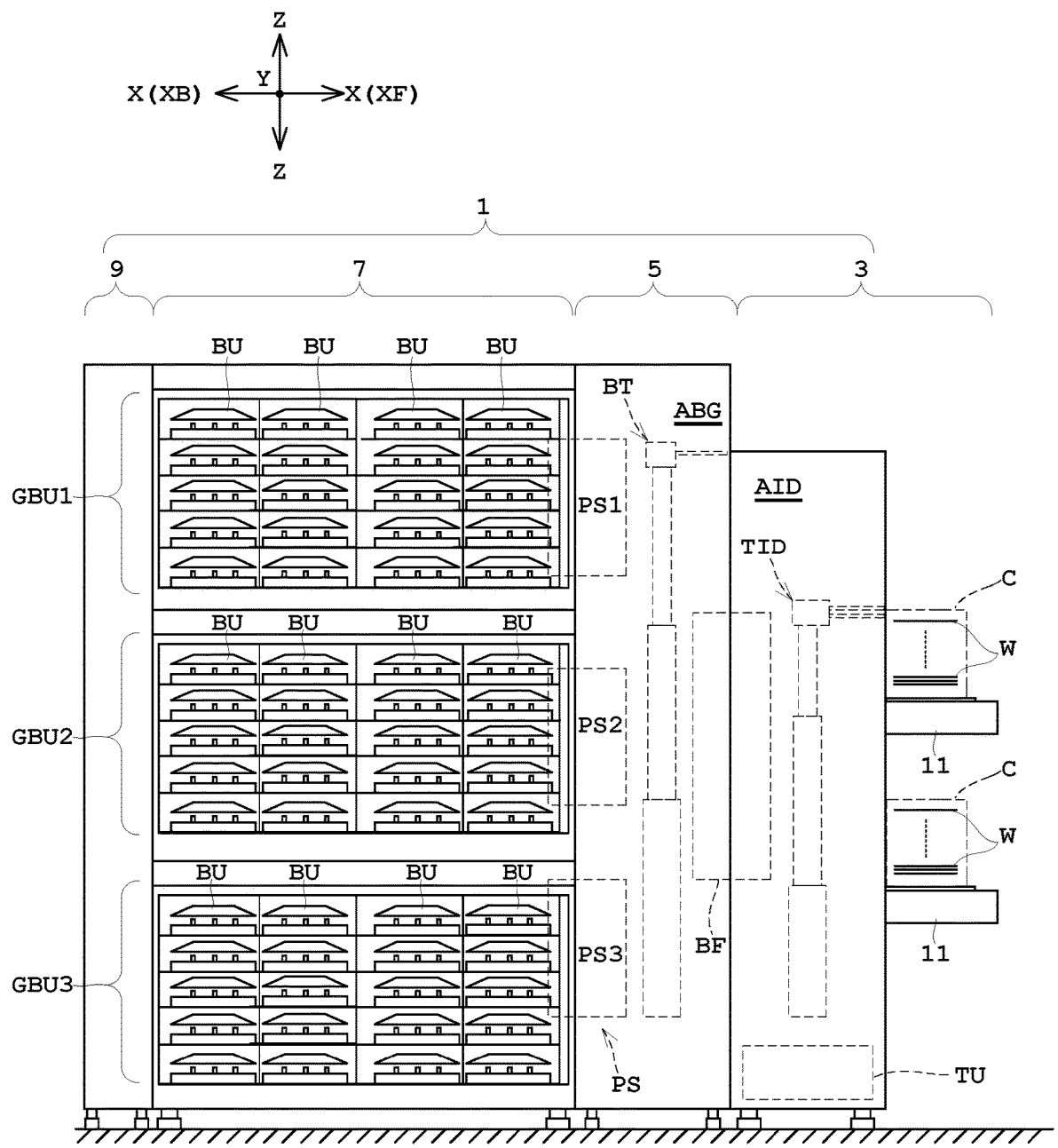
FIG. 4 is a left side view of the substrate treating apparatus.
Figure 5:
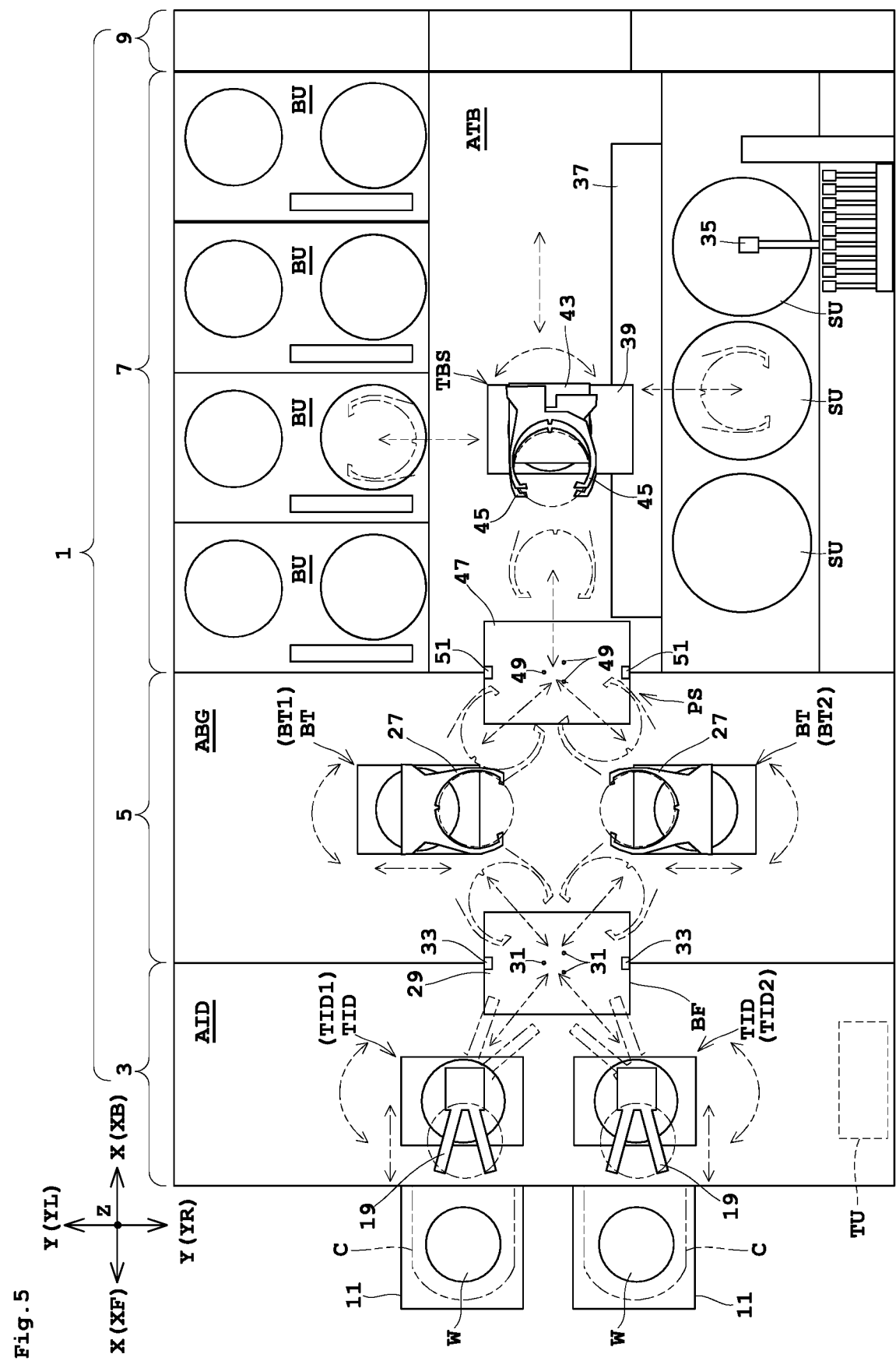
FIG. 5 is a plan view of the substrate treating apparatus.
Figure 6:
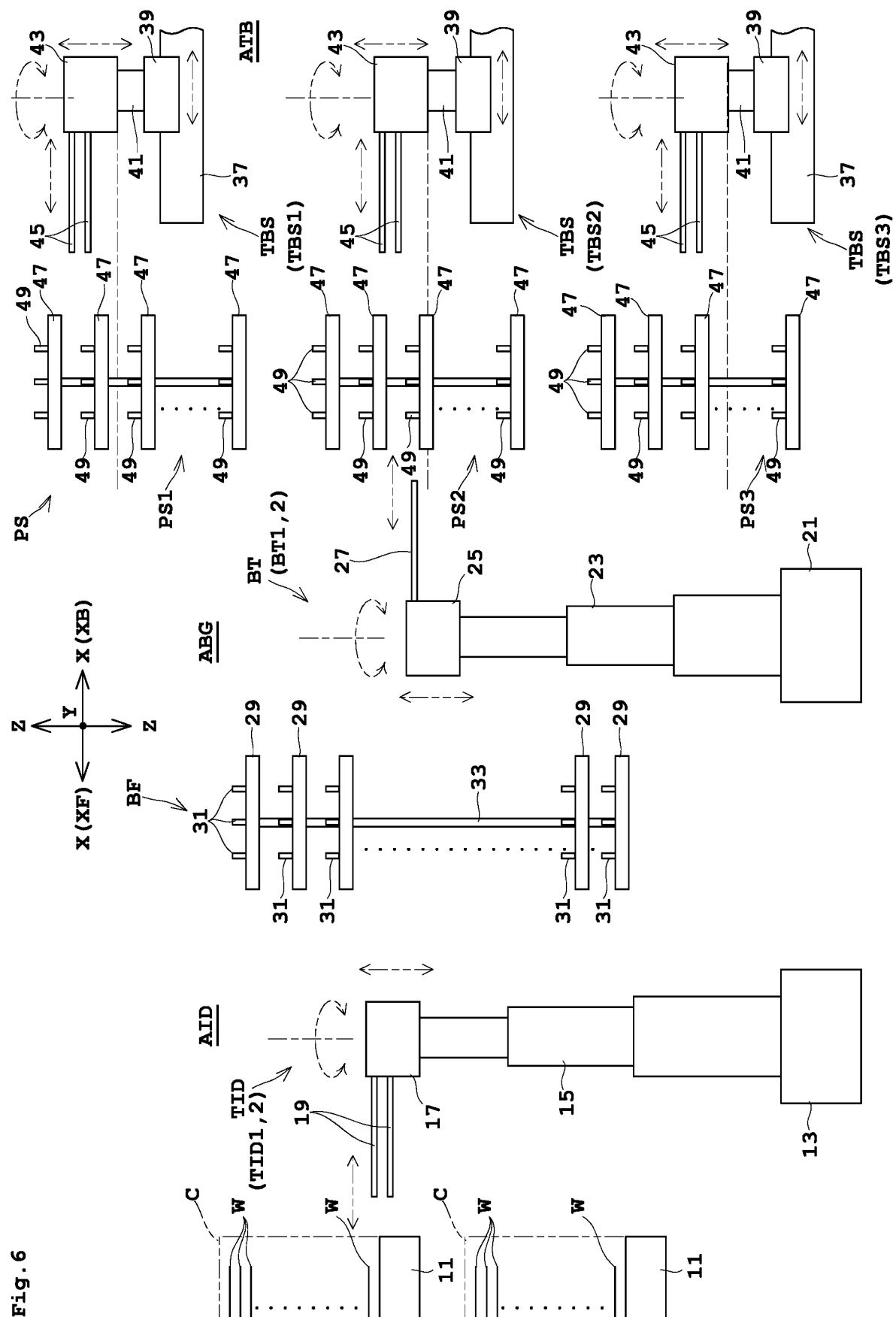
FIG. 6 is a right side view showing a transport system.

FIG. 1 is a perspective view showing an entire construction of a substrate treating apparatus according to the embodiment. FIG. 2 is a right side view of the substrate treating apparatus. FIG. 3 is a rear view of the substrate treating apparatus. FIG. 4 is a left side view of the substrate treating apparatus. FIG. 5 is a plan view of the substrate treating apparatus. FIG. 6 is a right side view showing a transport system.

A substrate treating apparatus 1 according to this embodiment includes an indexer block 3, a bridge block 5, a treating block 7, and a utility block 9.

The indexer block 3 is connected to the bridge block 5 for transferring wafers W under treatment to and from the bridge block 5. The bridge block 5 is connected to the treating block 7 for transferring the wafers W to and from the treating block 7. The treating block 7 supplies a treating solution to the wafers W received from the bridge block 5, then carries out treatment for forming film on the wafers W by heating, and transports the wafers W having undergone the treatment to the bridge block 5. The utility block 9 is connected to the treating block 7, has components for feeding the treating solution to the treating block 7. An exposing device, not shown, may be provided adjacent and connected to a rear end of the utility block 9.

The above indexer block 3, bridge block 5, treating block 7, and utility block 9 are arranged in this order in a row.

In the following description, the direction in which the indexer block 3, bridge block 5, treating block 7, and utility block 9 are arranged is assumed to be "fore and aft direction X" (horizontal direction). In particular, the direction pointing from the utility block 9 toward the indexer block 3 is assumed to be "forward XF", and the direction counter to the forward XF direction is assumed to be "backward XB". The direction extending horizontally and perpendicular to the fore and aft direction X is assumed to be "transverse direction Y". Further, as seen from the front of the indexer block 3, one direction of the transverse direction Y is assumed to be "the right side YR" as appropriate, and the other direction opposite to the right side YR "the left side YL". The vertical direction is assumed to be "up-down direction Z" (height direction or perpendicular direction). When simply written "lateral", "sideways", or the like, it is limited to neither the fore and aft direction X nor the transverse direction Y.

The indexer block 3 has carrier receivers 11, a transporting space AID, indexer's transport robots TID, and a treating solution tank install portion TU. The indexer block 3 has four carrier receivers 11 in this embodiment. Specifically, two carrier receivers 11 are arranged in the transverse direction, with one carrier receiver 11 located over each carrier receiver 11 in the up-down direction Z. Each carrier receiver 11 receives a carrier C placed thereon. Each carrier C can hold a plurality of (e.g. 50) wafers W stacked therein. For example, the carriers C are transferred to and from an OHT (Overhead Hoist Transport: also called an overhead traveling automatic guided vehicle). The OHT transports the carriers C using the ceiling of a cleanroom. The OHT, since it cannot transfer the carriers C directly to and from the carrier receivers 11 located underneath in the up-down direction Z, transfers the carriers C to and from the carrier receivers 11 located underneath in the up-down direction Z by using, for example, a carrier crane not shown. The carriers C may be FOUPs (Front Opening Unified Pods), for example.

The transporting space AID is located backward XB of the carrier receivers 11. The indexer's transport robots TID are arranged in the transporting space AID. The indexer's transport robots TID transfer the wafers W to and from the carriers C and to and from the bridge block 5. The number of indexer's transport robots TID is two. The position of each indexer's transport robot TID is fixed in the fore and aft direction X and transverse direction Y. Each indexer's transport robot TID is located in a position opposed in the transverse direction Y to two carrier receivers 11 arranged in the up-down direction Z. In other words, one indexer's transport robot TID is located in a substantially middle position in the transverse direction Y and spaced backward XB from and opposed to a pair of carrier receivers 11 arranged in the up-down direction Z. In the following description, where the two indexer's transport robots TID need to be distinguished, one will be called indexer's transport robot TID1, and the other will be called indexer's transport robot TID2.

The above indexer's transport robots TID correspond to the "indexer robots" in this invention.

Since each of the indexer's transport robots TID1 and TID2 is located in the position opposed to the carrier receivers 11 as described above, its arms 19 may only be advanced to and withdrawn from the carrier receivers 11 when transferring the wafers W to and from the carrier receivers 11. Consequently, the wafers W can be transferred efficiently.

As shown in FIG. 6, each of the indexer's transport robots TID has a base block 13, a telescopic portion 15, a holder 17, and two arms 19. The base block 13 is, as shown in FIG. 5, located in a position opposed to the carrier receivers 11 and fixed in the fore and aft direction X and transverse direction Y. The telescopic portion 15 is mounted on the base block 13 to be extendible and contractible in the up-down direction Z. The holder 17 is mounted on top of the telescopic portion 15 to be rotatable relative to the base block 13 and telescopic portion 15 about an axis extending in the up-down direction Z. The two arms 19 are held by the holder 17 as stacked in the up-down direction Z and maintained in horizontal position, and are constructed capable of advancing and withdrawing in the fore and aft direction X at the same time. Each indexer's transport robot TID is movable up and down by extension and contraction of the telescopic portion 15, whereby the two arms 19 reach the upper and lower carrier receivers 11 in the up-down direction Z, and reach a top stage and a bottom stage of a buffer BF described hereinafter.

The bridge block 5 has a transporting space ABG, bridge's transport robots BT, the buffer BF, and a pass PS.

The bridge's transport robots BT are arranged in the transporting space ABG. Specifically, two bridge's transport robots BT are arranged. The bridge's transport robots BT are arranged backward XB of the respective indexer's transport robots TID and the buffer BF. The bridge's transport robots BT are arranged opposite each other, on the right side YR and left side YL, across a line linking the buffer BF and pass PS. Each bridge's transport robot BT is located in a position fixed in the fore and aft direction X and transverse direction Y. In the following description, where the two bridge's transport robots BT need to be distinguished, one will be called bridge's transport robot BT1, and the other will be called bridge's transport robot BT2.

The above bridge's transport robots BT correspond to the "bridge robots" in this invention.

As shown in FIG. 6, each of the bridge's transport robots BT has a base block 21, a telescopic portion 23, a holder 25, and one arm 27. The base block 21 is, as shown in FIG. 5, located in a position backward XB of and opposed to the indexer's transport robot TID and fixed in the fore and aft direction X and transverse direction Y. The telescopic portion 23 is mounted on the base block 21 to be extendible and contractible in the up-down direction Z. The holder 25 is mounted on top of the telescopic portion 23 to be rotatable relative to the base block 21 and telescopic portion 23 about an axis extending in the up-down direction Z. The one arm 27 is held by the holder 25 as maintained in horizontal position, and is constructed capable of advancing and withdrawing in the fore and aft direction X. Each bridge's transport robot BT is movable up and down by extension and contraction of the telescopic portion 23, whereby the arm 27 reaches the top stage and bottom stage of the buffer BF in the up-down direction Z, and reaches a top stage and a bottom stage of the pass PS.

The buffer BF is disposed on a boundary between the indexer block 3 and bridge block 5 as shown in FIG. 5. As shown in FIG. 6, the buffer BF includes a plurality of tables 29 arranged at intervals in the up-down direction Z. Each of the tables 29 has three pins 31 erected thereon. The three pins 31 contact the lower surface of a wafer W to support the wafer W in horizontal position. The three pins 31 have just a length for allowing the arms 19 and 27 to advance to the lower surface of the wafer W supported by the pins 31.

The buffer BF is located in a position for enabling transfer of the wafers W with the two indexer's transport robots TID described hereinbefore, and in a position for enabling transfer of the wafers W with the two bridge's transport robots BT. That is, the buffer BF is located in a position for enabling transfer to and from different tables 29 at the same time by the two indexer's transport robots TID and the two bridge's transport robots BT. In other words, the buffer BF is constructed accessible to six arms 19 and 27 at the same time, which are the two arms 19 of the indexer's transport robot TID1, the two arms 19 of the indexer's transport robot TID2, and the two arms 27 of the bridge's transport robots BT1 and BT2. Thus, as shown in FIG. 5, the buffer BF is, for example, erected in the up-down direction Z in a partition between the indexer block 3 and bridge block 5, with the tables 29 supported at intervals by support pillars 33 arranged opposite each other across the tables 29. Consequently, the buffer BF is concurrently accessible from four directions.

Preferably, the buffer BF is arranged as follows. The position in the up-down direction Z of the buffer BF is set to about midway in the height of the indexer block 3. Specifically, its level is not higher than the upper ends of carriers C placed on the upper carrier receivers 11, and not lower than the lower ends of carriers C placed on the lower carrier receivers 11. The upper end of each carrier C is the uppermost part of the carrier C itself which contacts the OHT. The lower end of each carrier C is the lowermost part of the carrier C itself which contacts the carrier receiver 11. The position in the up-down direction Z of the buffer BF relative to the pass PS described hereinafter is not higher than the upper end of the top stage of the pass PS and not lower than the lower end of the bottom stage of the pass PS.

The height in the up-down direction Z of the buffer BF regulated this way realizes an efficient transportation of the wafers W between the carriers C and buffer BF by the indexer's transport robots TID, since restrictions are set on heights to which the indexer's transport robots TID are raised and lowered.

The treating block 7 will now be described before the pass PS.

As shown in FIG. 5, the treating block 7 has a transporting space ATB formed in the fore and aft direction X and disposed in a substantially middle part in the transverse direction Y in plan view. The treating block 7 has the pass PS on the boundary with the bridge block 5. The treating block 7 has four heat-treating units BU arranged on the left side YL of the transporting space ATB, and three coating units SU on the right side YR opposed to the four heat-treating units BU across the transporting space ATB. The three coating units SU have a nozzle 35. This nozzle 35 is supplied with the treating solution through the utility block 9 from the treating solution tank install portion TU provided in a lower part of the indexer block 3. The heat-treating units BU perform treatment for heating the wafers W and treatment for cooling heat-treated wafers W, for example.

As shown in FIGS. 3 and 4, the treating block 7 has the four heat-treating units BU arranged in the fore and aft direction X, and these four heat-treating units BU are provided on each of five stories arranged in the up-down direction Z. Under the heat-treating units BU on the five stories and spaced therefrom in the up-down direction Z are similar heat-treating units BU arranged on the five stories. Further, under these similar heat-treating units BU arranged on the five stories and spaced therefrom in the up-down direction Z, there are another similar heat-treating units BU arranged on five stories. Here, the heat-treating units BU provided on the top five stories will be referred to as the first heat-treating unit group GBU1. The heat-treating units BU provided on the intermediate five stories will be referred to as the second heat-treating unit group GBU2. The heat-treating units BU provided on the bottom five stories will be referred to as the third heat-treating unit group GBU3.

As shown in FIGS. 2 and 3, the treating block 7 has the three coating units SU arranged in the fore and aft direction X, and these three coating units SU are provided on each of six stories arranged in the up-down direction Z. Here, the coating units SU provided on the top two stories will be referred to as the first coating unit group GSU1. The coating units SU provided on the intermediate two stories will be referred to as the second coating unit group GSU2. The coating units SU provided on the bottom two stories will be referred to as the third coating unit group GSU3.

As described above, the treating block 7 includes a plurality of stories with the heat-treating units BU forming 15 stories and the coating units SU forming six stories. The number of stories in the treating block 7 in this embodiment, in order to increase throughput higher than the conventional example, provides the number of units about 1.5 times that of the treating block in the conventional example. Conse-quently, the treating block 7 is constructed higher than the indexer block 3 having a height restricted by the OHT moving to and fro overhead.

Treating block's transport robots TBS are arranged in the transporting space ATB for transporting the wafers W between the plurality of stories in the treating block 7, that is between the first heat-treating unit group GBU1, first coating unit group GSU1, and pass PS, between the second heat-treating unit group GBU2, second coating unit group GSU2, and pass PS, and between the third heat-treating unit group GBU3, third coating unit group GSU3, and pass PS. Specifically, a treatment block's transport robot TBS1 carries out transportation to and from the first heat-treating unit group GBU1 and so on. A treatment block's transport robot TBS2 carries out transportation to and from the second heat-treating unit group GBU2 and so on. A treatment block's transport robot TBS3 carries out transportation to and from the third heat-treating unit group GBU3 and so on.

As shown in FIGS. 5 and 6, each treatment block's transport robot TBS includes a moving mechanism 37, and a movable base block 39 moved by the moving mechanism 37. Further, a telescopic portion 41, a holder 43, and two arms 45 are mounted on the movable base block 39. The moving mechanism 37 moves the movable base block 39 in the fore and aft direction X. The telescopic portion 41 mounted on the movable base block 39 moves the holder 43 in the up-down direction Z by extending and contracting in the up-down direction Z. The two arms 45 are attached to the holder 43 as stacked in the up-down direction Z, and to be capable of advancing and withdrawing in a horizontal plane including the fore and aft direction X and transverse direction Y. The two arms 45 are constructed to be alternately driven to advance and withdraw, and are incapable of advancing or withdrawing at the same time.

The pass PS noted hereinbefore has a construction similar to the buffer BF as shown in FIGS. 5 and 6.

The pass PS is disposed on the boundary between the bridge block 5 and treating block 5. The pass PS includes a plurality of tables 47 arranged at intervals in the up-down direction Z. Each of the tables 47 has three pins 49 erected thereon. The three pins 49 contact the lower surface of a wafer W to support the wafer W in horizontal position. The three pins 49 have just a length for allowing the arms 27 and 45 to advance to the lower surface of the wafer W supported by the pins 49.

The pass PS is located in a position for enabling transfer of the wafers W with the two bridge's transport robots BT, and in a position for enabling transfer of the wafers W with the three treating block's transport robots TBS described above. That is, the pass PS is located in a position for enabling transfer to and from different tables 47 at the same time by the two bridge's transport robots BT and the three treating block's transport robots TBS. In other words, the pass PS is constructed accessible to five arms 27 and 45 at the same time, which are the two arms 27 and the three arms 45. Thus, as shown in FIG. 5, the pass PS is, for example, erected in the up-down direction Z in a partition between the bridge block 5 and treating block 7, with the tables 47 supported at intervals by support pillars 51 arranged opposite each other across the tables 47 in the transverse direction Y. Consequently, the pass PS is accessible from three directions.

As shown in FIG. 6, the pass PS does not have an integral construction, but is separated into three parts in the up-down direction Z, for example. Here, a first pass portion PS1 is located in a position corresponding to the first heat-treating unit group GBU1 and first coating unit group GSU1. A second pass portion PS2 is located in a position corresponding to the second heat-treating unit group GBU2 and second coating unit group GSU2. A third pass portion PS3 is located in a position corresponding to the third heat-treating unit group GBU3 and third coating unit group GSU3. Further, as shown in FIGS. 2, 4 and 6, the first pass portion PS1 is located at a slightly downward level in the up-down direction Z relative to the stories of the first heat-treating unit group GBU1 and first coating unit group GSU1 of the treating block 7. The second pass portion PS2 is located substantially at a middle level in the up-down direction Z relative to the stories of the second heat-treating unit group GBU2 and second coating unit group GSU2 of the treating block 7. The third pass portion PS3 is located substantially at a slightly upward level in the up-down direction Z relative to the stories of the third heat-treating unit group GBU3 and third coating unit group GSU3 of the treating block 7.

The construction described above, wherein the pass PS is separated into the pass portions PS1-PS3 which are arranged in such positional relationship in the up-down direction Z, can shorten distances of up-and-down movement required of the bridge's transport robots BT to transfer the wafers W to and from the pass portions PS1-PS3. Consequently, the efficiency of transport by the bridge's transport robots BT to and from the pass portions PS1-PS3 can be improved. Further, since the pass PS is constructed of the plurality of pass portions PS1-PS3, a weight saving of the pass PS can be attained.

The above pass portions PS1-PS3 correspond to the "discrete pass portions" in this invention.

When seen from the rear face of the treating block 7, as shown in FIG. 3, the transporting space ATB is not partitioned off for each of the transport robots TBS1-TBS3 described above. That is, partitions extending between the heat-treating units BU and coating units SU are omitted. This allows the operator to work with increased ease for maintenance of the treating block's transport robots TBS1-TBS3.

The above treating block 7 is supplied with the treating solution which is received by the coating units SU from the treating solution tank install portion TU as shown in FIG. 2. For this purpose, pumps and filters 61 in the utility block 9 are used. In this embodiment, the utility block 9 has the pumps and filters 61 arranged therein for supplying the treating solution to the coating units SU on each of the two stories of the first coating unit group GSU1, the coating units SU on each of the two stories of the second coating unit group GSU2, and the coating units SU on each of the two stories of the third coating unit group GSU3.

Specifically, the pumps and filters 61 are arranged downward in order from a position below the top story in the treating block 7. That is, the top story corresponds to the coating units SU on the upper story of the first coating unit group GSU1, and the pump and filter 61 for supplying the treating solution to these coating units SU are located backward XB of the coating units SU on the lower story of the first coating unit group GSU1. The pump and filter 61 for supplying the treating solution to the lower story of the first coating unit group GSU1 are located backward XB of the coating units SU on the upper story of the second coating unit group GSU2. The pump and filter 61 for supplying the treating solution to the upper story of the second coating unit group GSU2 are located backward XB of the coating units SU on the lower story of the second coating unit group GSU2. The pump and filter 61 for supplying the treating solution to the lower story of the second coating unit group GSU2 are located backward XB of the coating units SU on the upper story of the third coating unit group GSU3. The pump and filter 61 for supplying the treating solution to the upper story of the third coating unit group GSU3 are located backward XB of the coating units SU on the lower story of the third coating unit group GSU3. The pump and filter 61 for supplying the treating solution to the lower story of the third coating unit group GSU3 are located below and backward XB of the coating units SU on the lower story of the coating unit group GSU3.

This embodiment, with the pumps and filters 61 arranged as described above, realizes equal distances from the pumps and filters 61 to the nozzles 35, and besides can inhibit negative pressure occurring at the time of sucking up the treating solution from treating solution tanks in the treating solution tank install portion TU located in the lower part of the indexer block 3. Consequently, foaming of the treating solution can be inhibited to improve the quality of treatment with the treating solution.

The substrate treating apparatus constructed as described above carries out treatment of the wafers W as follows, for example. The treatment includes baking (hereafter called dehydration bake) the wafers W, forming film on the wafers W by supplying the treating solution thereto, for example, and thereafter baking (hereafter called prebake) the wafers W.

First, four carriers C containing wafers W to be treated are placed on the four carrier receivers 11. Next, each of the indexer's transport robots TID1 and TID2 of the indexer block 3 accesses one carrier C, takes the wafers W, two at a time, out of the carrier C, and places the wafers W on unoccupied tables 29 of the buffer BF. The indexer's transport robots TID1 and TID2 repeat this intake operation until all the carriers C become empty.

In parallel with the above intake operation, the bridge's transport robots BT1 and BT2 of the bridge block 5 transport the wafers W from the buffer BF to unoccupied tables 47 of one of the pass portions PS1, PS2 and PS3 corresponding to a destination story of the treating block 7. The wafers W transported to the pass PS are transported by the treating block's transport robots TBS1-TBS3 to certain of the heat-treating units BU which perform heat treatment for dehydration bake. The wafers W having finished the heat treatment are transported by the treating block's transport robots TBS1-TBS3 to certain of the coating units SU for film forming. Then, the wafers W are transported by the treating block's transport robots TBS1-TBS3 to certain of the heat-treating units BU for pre-bake treatment. The wafers W having finished all the treatment are transported through the pass PS, bridge block 5, and indexer block 3 to be fed to the carriers C which remain on the carrier receivers 11 and in which the wafers W were stored before the treatment.

According to this embodiment, as described above, the bridge block 5 has the pass PS ranging from bottom story to top story in the treating block 7. Consequently, although the arms 19 of the indexer's transport robots TID do not reach the top story of the treating block 7, the bridge block 5 with the two bridge's transport robots BT1 and BT2 can transport the wafers W placed in the buffer BF from the carriers C on the carrier receivers 11 by the indexer's transport robots TID, through the pass PS also to the heat-treating units BU and coating units SU on the top story in the treating block 7. As a result, throughput can be improved with an increase in the number of stories in the treating block 7.

This invention is not limited to the foregoing embodiment, but may be modified as follows:

(1) The foregoing embodiment provides four carrier receivers 11, but this invention is not limited to such construction. The number of carrier receivers 11 may, for example, be two or more than four.

(2) In the foregoing embodiment, the indexer's transport robots TID1 and TID2 are arranged opposite the fronts of the carrier receivers 11. This invention is not limited to such construction. That is, the indexer's transport robots TID1 and TID2 need not be in the positions opposite the fronts of the carrier receivers 11 as long as these transport robots TID1 and TID2 are in positions enabling access to the carrier receivers 11 and to the buffer BF. Each indexer's transport robot TID has two arms 19. This invention is not limited to such construction, but each transport robot TID may have one arm or three or more arms.

(3) In the foregoing embodiment, the two indexer's transport robots TID1 and TID2 are arranged opposite the fronts of the carrier receivers 11. This invention is not limited to such construction. That is, the two indexer's transport robots TID1 and TID2 may be replaced with one indexer's transport robot TID as long as this transport robot TID is in a position enabling access to the carrier receivers 11 and to the buffer BF.

(4) In the foregoing embodiment, each indexer's transport robot TID has the base block 13, telescopic portion 15, holder 17, and arms 19. This invention is not limited to such construction. That is, each indexer's transport robot TID may be constructed in any way as long as it is fixed without moving horizontally and is capable of accessing the carrier receivers 11 and buffer BF.

(5) In the foregoing embodiment, the buffer BF holds a plurality of tables 29 with the support pillars 33 to be accessible from four directions. This invention is not limited to such construction as long as the buffer BF is accessible from four directions.

(6) In the foregoing embodiment, each bridge's transport robot BT has the base block 21, telescopic portion 23, holder 25, and arm 27. This invention is not limited to such construction. That is, each bridge's transport robot BT may be constructed in any way as long as it is fixed without moving horizontally and is capable of accessing the buffer BF and pass PS.

(7) In the foregoing embodiment, the pass PS holds a plurality of tables 49 with the support pillars 51 to be accessible from three directions. This invention is not limited to such construction as long as the pass PS is accessible from three directions. Further, the embodiment employs the construction having the divided pass portions PS1-PS3, but the pass PS may be constructed integral.

(8) In the foregoing embodiment, the pumps and filters 61 are arranged below the top story. This invention is not limited to such construction.

(9) The foregoing embodiment has been described taking FOUPs as an example of carriers C. This invention is not limited to FOUPs.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for use with an overhead traveling automatic guided vehicle provided in a cleanroom, the substrate treating apparatus comprising:
   an indexer block including at least two carrier receivers for transferring carriers storing substrates to and from the overhead traveling automatic guided vehicle, and indexer robots provided for the respective carrier receivers and disposed in horizontally fixed positions relative to the carrier receivers, each of the indexer robots having arms capable of advancing and withdrawing horizontally, rotating in horizontal planes, and movable up and down for taking the substrates out of the carriers on the carrier receivers and loading the substrates into the carriers on the carrier receivers;
   a bridge block disposed adjacent the indexer block; and
   a treating block disposed adjacent the bridge block and including a plurality of stacked stories each having at least one treating unit;
   wherein the indexer block has a height less than a top story of the treating block; and
   the bridge block includes:
   a buffer disposed in a position adjacent the indexer block to be capable of transferring the substrates with the indexer robots, and having a plurality of tables arranged in a height direction for receiving the substrates;
   a pass disposed in a position adjacent the treating block to be capable of transferring the substrates to and from the treating block, and having a plurality of tables arranged in a direction of the stories of the treating block and covering a range from a bottom story to a top story of the treating block for receiving the substrates; and
   two bridge robots each having an arm for transferring the substrates between the buffer and the pass.

2. The substrate treating apparatus according to claim 1, wherein:
   the treating block includes one transport robot for each predetermined number of stories for transferring the substrates to and from the treating unit and the pass; and
   the pass includes a plurality of discrete pass portions arranged separately for the each predetermined number of stories.

3. The substrate treating apparatus according to claim 2, wherein, of the discrete pass portions, an upper discrete pass portion is located at a downward level relative to a predetermined number of upper stories, a middle discrete pass portion is located at a middle level relative to a predetermined number of middle stories, and a lower discrete pass portion is located at an upward level relative to a predetermined number of lower stories.

4. The substrate treating apparatus according to claim 2, wherein the treating block has, omitted therefrom, a partition between transport robots each provided for the predetermined number of stories.

5. The substrate treating apparatus according to claim 3, wherein the treating block has, omitted therefrom, a partition between the transport robots each provided for the predetermined number of stories.

6. The substrate treating apparatus according to claim 1, wherein:
   the treating unit has a coating unit for supplying a treating solution to the substrates; and
   pumps and filters, which supply the treating solution to the treating unit on each story from a treating solution tank disposed in a lower part for storing the treating solution, are arranged below a top story of the plurality of stories.

7. The substrate treating apparatus according to claim 2, wherein:
   the treating unit has a coating unit for supplying a treating solution to the substrates; and pumps and filters, which supply the treating solution to the treating unit on each story from a treating solution tank disposed in a lower part for storing the treating solution, are arranged below a top story of the plurality of stories.

8. The substrate treating apparatus according to claim 3, wherein:
the treating unit has a coating unit for supplying a treating solution to the substrates; and
pumps and filters, which supply the treating solution to the treating unit on each story from a treating solution tank disposed in a lower part for storing the treating solution, are arranged below a top story of the plurality of stories.

9. The substrate treating apparatus according to claim 4, wherein:
the treating unit has a coating unit for supplying a treating solution to the substrates; and
pumps and filters, which supply the treating solution to the treating unit on each story from a treating solution tank disposed in a lower part for storing the treating solution, are arranged below a top story of the plurality of stories.

10. The substrate treating apparatus according to claim 1, wherein the indexer block has the indexer robots each located opposite one of the carrier receivers.

11. The substrate treating apparatus according to claim 2, wherein the indexer block has the indexer robots each located opposite one of the carrier receivers.

12. The substrate treating apparatus according to claim 3, wherein the indexer block has the indexer robots each located opposite one of the carrier receivers.

13. The substrate treating apparatus according to claim 4, wherein the indexer block has the indexer robots each located opposite one of the carrier receivers.

14. The substrate treating apparatus according to claim 6, wherein the indexer block has the indexer robots each located opposite one of the carrier receivers.

15. The substrate treating apparatus according to claim 1, wherein:
at least two carrier receivers are arranged vertically; and
the buffer has a height equal to or lower than an upper end of a carrier placed on an uppermost one of the carrier receivers.

16. The substrate treating apparatus according to claim 2, wherein:
at least two carrier receivers are arranged vertically; and
the buffer has a height equal to or lower than an upper end of a carrier placed on an uppermost one of the carrier receivers.

17. The substrate treating apparatus according to claim 1, wherein:
at least two carrier receivers are arranged vertically; and
the buffer has a height equal to or higher than a lower end of a carrier placed on an lowermost one of the carrier receivers.

18. The substrate treating apparatus according to claim 2, wherein:
at least two carrier receivers are arranged vertically; and
the buffer has a height equal to or higher than a lower end of a carrier placed on a lowermost one of the carrier receivers.

19. The substrate treating apparatus according to claim 1, wherein the buffer has a height equal to or lower than an upper end of an uppermost pass portion, and equal to or higher than a lower end of a lowermost pass portion.

20. The substrate treating apparatus according to claim 2, wherein the buffer has a height equal to or lower than an upper end of an uppermost pass portion, and equal to or higher than a lower end of a lowermost pass portion.

* * * * *